United States Patent [19]

Tabarelli et al.

[11] Patent Number: 4,592,648
[45] Date of Patent: Jun. 3, 1986

[54] DEVICE FOR PROJECTION COPYING OF MASKS ONTO A WORKPIECE

[75] Inventors: Werner Tabarelli; Herbert E. Mayer, both of Fürstentum, Liechtenstein

[73] Assignee: Perkin-Elmer Censor Anstalt, Vaduz, Liechtenstein

[21] Appl. No.: 693,774

[22] Filed: Jan. 23, 1985

[51] Int. Cl.[4] .............................................. G03B 27/52
[52] U.S. Cl. ........................................ 355/43; 355/53; 355/45; 356/401; 250/548
[58] Field of Search ................. 355/43, 53, 45; 354/4; 356/400, 401; 250/548; 350/96.2

[56] References Cited

U.S. PATENT DOCUMENTS

| | | | |
|---|---|---|---|
| 3,865,483 | 2/1975 | Wojcik | 355/43 |
| 4,362,385 | 12/1982 | Lobach | 250/548 X |
| 4,452,506 | 6/1984 | Reeve et al. | 350/96.2 |

FOREIGN PATENT DOCUMENTS 0035113 9/1981 European Pat. Off. .

OTHER PUBLICATIONS

Markt and Technik, Nr. 34, Aug. 1983, pp. 28 and 31.

Primary Examiner—L. T. Hix
Assistant Examiner—Brian W. Brown
Attorney, Agent, or Firm—Pahl, Lorusso & Loud

[57] ABSTRACT

For a device for projection copying of masks on a semiconductor substrate for the manufacture of integrated circuits, it is intended that the copying of an adjusting mark of the workpiece onto a sensor takes place by means of the projection lens, whereby the directly reflected beams of the light which makes visible the adjusting mark are masked out by a mirror, and the position-sensitive sensor is fastened at the underside of the frame carrying the mask.

5 Claims, 6 Drawing Figures

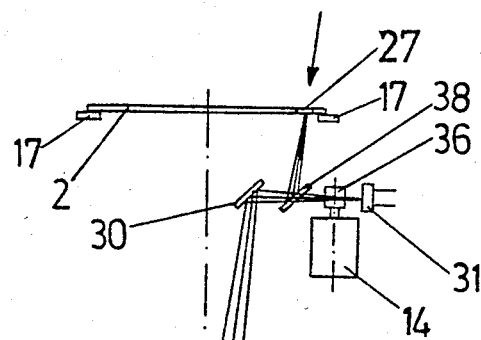
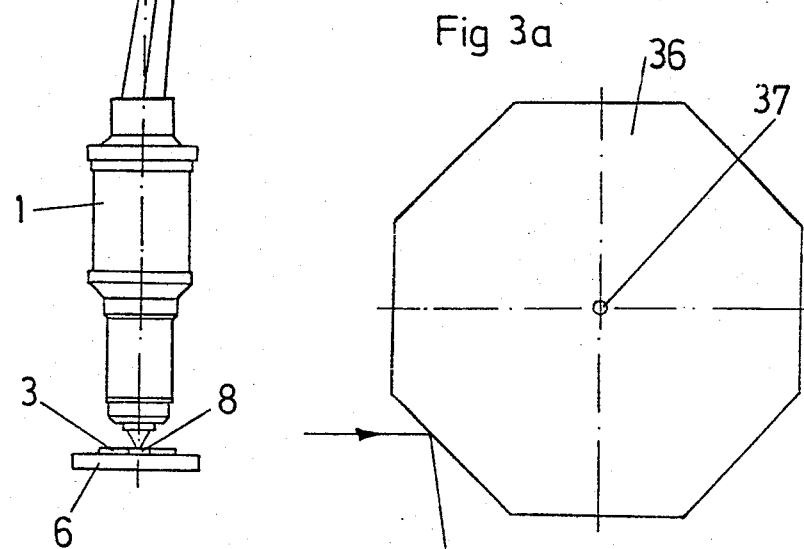
Fig. 3
Fig 3a
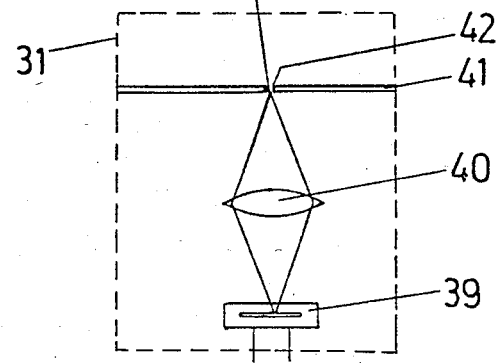

DEVICE FOR PROJECTION COPYING OF MASKS ONTO A WORKPIECE

BACKGROUND OF THE INVENTION

The invention concerns a device for projection copying of masks onto a workpiece, particularly onto a semiconductor substrate, for the manufacturing of integrated circuits, whereby the patterns for the masks are copied once or several times on a light-sensitive layer of the workpiece by way of a projection lens, and the mask and workpiece are oriented to each other in a relative way such that the orientation pattern of the mask and the adjusting mark of the workpiece are thereby brought into a pre-determined spatial arrangement, so that the relative position of a sensor as well as of the orientation pattern of the mask and at least one reference mark for the workpiece on the base table are determined and then the adjusting mark of the workpiece is copied onto the sensor.

The simplest way of orienting the mask and the workpiece opposite each other is basically to align a mark on a mask with a mark on the workpiece by way of a projection lens. Due to the lacquer layers covering the workpiece necessary for the manufacturing of integrated circuits, there is, however, sometimes interference which hinders a reliable evaluation of the precision of the copying of both marks to one another. In such cases one must use procedures described at the outset which are relatively time-consuming and are not used for each single part of the workpiece but optimally only once for a step-wise exposure of an entire workpiece, that is for the so-called global adjustment.

Such a process is known from the European patent application No. 0045113, in which a mark aligned with a sensor is projected onto a reference mark aligned on the base table, that is the adjusting mark of the workpiece, by means of an accessory lens parallel to the projection lens. The same parallel lens is used to check the precision of this copying. Since the accessory lens allows a broad-band exposure in contrast to the projection lens, there are here no more interference phenomena. The imprecise knowledge of the opposite arrangement of accessory lens and projection lens is, however, a source of error.

SUMMARY OF THE INVENTION

The invention avoids the use of a parallel accessory lens for the projection lens in a device of the above described type and allows the high precision of the projection lens to be made usable for adjustment as well. Here one starts with the assumption that in any observation in the dark field the light reflected back by the adjusting marks transfers significantly higher spatial frequencies of the adjusting mark structure and thus the interference phenomena that are in evidence are correspondingly less disturbing. However, it would not be possible to copy out an opening in the mask onto the adjusting mark of the workpiece either by way of the opening in the mask or by way of a slit, since the observation duration would increase too strongly due to the low light intensity of the dark field. The light reflected back from the adjusting mark must be cast onto a position-sensitive sensor such as a four-quadrant diode after the fading-out of the directly reflected beam. The arrangement of this sensor at the mask frame allows the adjustment necessary for the right setting to be carried out on the mask side instead of on the workpiece side, which has the known disadvantage that the displacement is an amount which is greater by the same amount as the mask in comparison with the image produced by the reducing projection lens.

As a whole, the invention is characterized by the fact that the projecting of the adjusting mark of the workpiece onto the sensor takes place by means of the projection lens, whereby the directly reflected beams which make visible the adjusting mark are masked out, and the position-sensitive sensor is installed at the underside of the frame carrying the mask.

The light intensity of the light falling upon the sensor can be increased by making the adjusting marks of the workpiece in the form of diffraction grids with lines crossing themselves and by choosing the lattice constant in such a way that as many diffraction coefficients as possible are taken in by the projection lens.

The position-sensitive sensor is preferably a four-quadrant diode. A grid diode could also be used. The use of a semiconductor bridge diode (see Markt & Technik Nr. 34, August 1983, page 28) is also recommended.

The masking out of the light directly reflected by the adjusting mark can be achieved by using a perforated mirror which allows the directly reflected light to pass and does not deviate it to the sensor. The preferable way is for the exposure of the adjusting mark of the workpiece to occur by way of a deviation mirror, which masks out the center of the light cone emanating from the adjusting mark.

If an adjusting light is used whose wavelength deviates from that of the light used for the development of the photo lacquer, then a pair of mirrors will compensate the difference of the focal distance of the projection lens at adjusting light and exposure light.

BRIEF DESCRIPTION OF THE DRAWINGS

Further details of the invention are explained as follows by way of the diagram.

Here are shown:

FIG. 3 is a view of a known device for the direct orientation of mask and substrate;

FIG. 3a is a detailed view of FIG. 3;

DETAILED DESCRIPTION OF THE PREFERRED EMBODIMENTS

Figure 1:
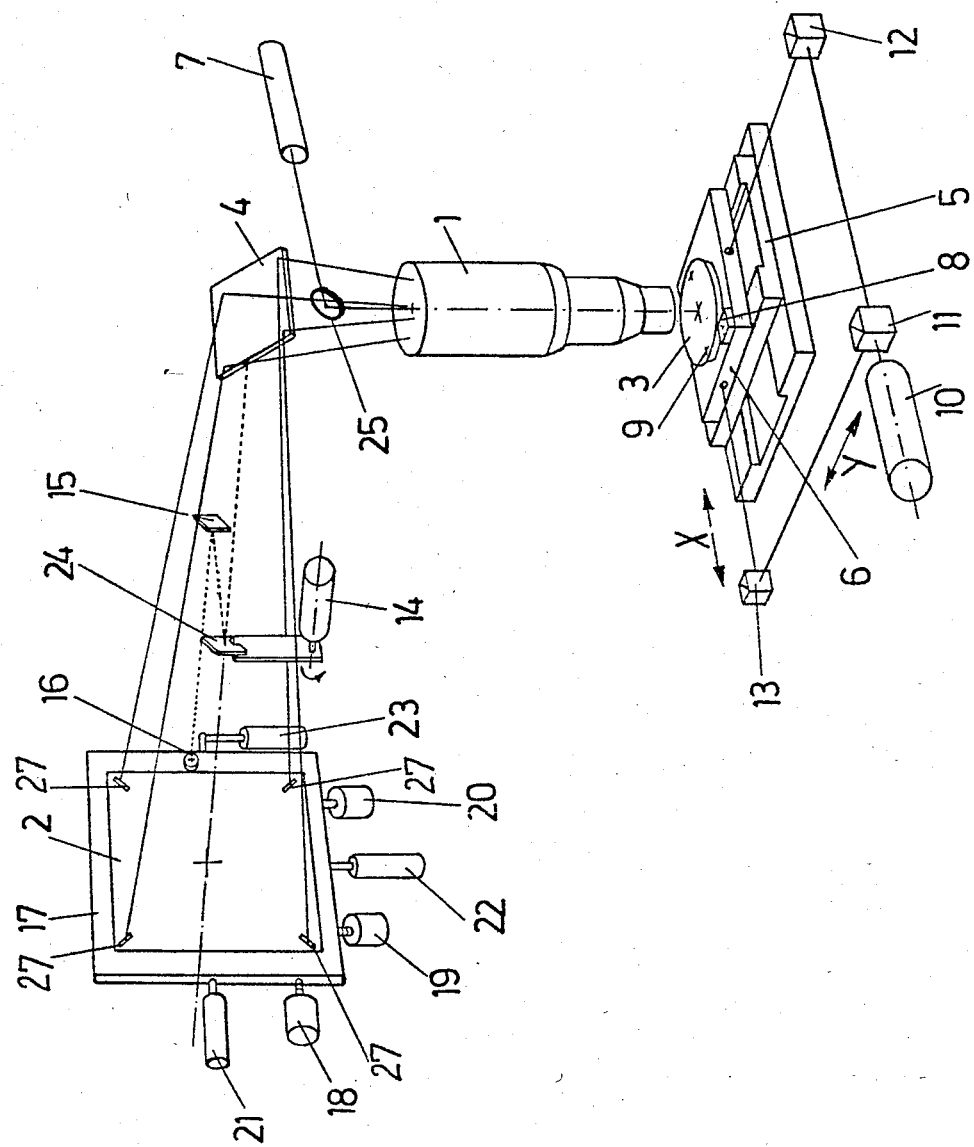
FIG. 1 is an overview the total arrangement of a device according to the invention.

FIG. 1 shows the important parts of an apparatus for the partial exposure of a semiconductor substrate. The workpiece 3 lies on a base table 6, which is in the form of a slide block and is adjustable parallel to the direction denoted with Y. It is carried by a slide block 5 which can also be adjusted in the X direction. These movements are controlled by interferometers 12 and 13, which form a part of a known laser interferometer along with the laser 10 and the beam-splitter 11. The exposure of the workpiece 3 takes place in that a pattern of the mask 2 is projected onto the workpiece by way of the deviation mirror 4 and the projection lens 1. During this exposure process which changes the photo lacquer on the workpiece 3 according to the pattern of the mask, the mirrors 24 and 15, as well as the mirror 25, which serve exclusively for the setting of the opposing position of mask 2 and workpiece 3, are located outside of the beam path of the exposure light.

In order to align the workpiece opposite the mask 2, marks 9 are made on the workpiece 3 and marks 27 are made on the mask. Further marks are found on the adjusting plate 8 found on the base table 6, and the center of sensor 16, which is on the underside of the frame 17 of mask 12, can also be taken as a mark.

The opposing alignment of the mask 2 and the workpiece 3 by means of the arrangement shown takes place in that first the marks 27 of the mask 2 are imaged onto the adjusting plate 8 by means of adjusting light which comes from a light source (not shown) behind mask 2, after the adjusting plate 8 has been slid under projection lens 1. The details of this actually well-known adjustment process are further described by way of FIGS. 2 to 4.

After the alignment of mask 2 relative to the adjustment plate 8, the mirrors 24 and 15 are brought into the position shown in FIG. 1 by pivot device, and the mirror 25 is brought into this position by way of a similiar pivoting device which is not shown for reasons of economy. A mark in the center of the adjusting plate 8 is then exposed by means of the adjusting laser 7 by way of the deviation mirror 25 and the projection lens 1. The mirror 25 is elliptical, whereby its projection in the direction of the optical axis is spherical. The light directly reflected by the mark onto the adjusting plate 8 then reaches, in a manner more precisely described through FIG. 5, sensor 16 by way of mirrors 24 and 15 only insofar it is not masked out by the deviation mirror 25. The sensor 16 is position-sensitive, that is, the signal given by it gives an indication of the precision with which the light strikes the center of the sensor.

Figure 2:
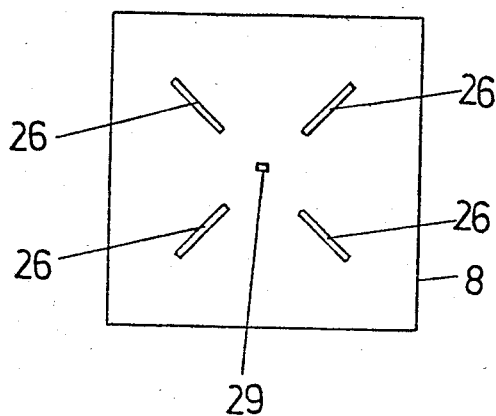
FIG. 2 is a top view of the adjusting plate carrying the reference mark.

Since the relative position of the marks on the adjusting plate 8 used in the processes described is well-known, the alignment of the mask 2 to the adjusting plate 8 and the determination of the relative position of the sensor 16 to the adjusting plate 8 allows the relative position of mask 2 and frame 17 to be clearly determined. If with this the base table 6 or the frame 17 including the mask 2 must be removed, the corresponding displacements are registered and stored by the laser interferometers 10 to 13 or by the length sensors 21 to 23, which determine the position of the frame parallel to the frame corner and in direction of rotation. The alignment of the workpiece 3 can only take place in the adjustment marks 9 on workpiece 3 are slid under the projection lens 1. The precise alignment of the workpiece 3 does not then take place by displacements of the slide blocks 5 and 6 which have to be extremely small due to the reduction effect of the projection lens, but by the displacement of the frame 17 by means of the propulsions 18 to 20. These change the position of the frame 17 parallel to its corners as well as its angular position in the frame plane until the light scattered by the adjusting mark 9 on the workpiece 3 is centered on the sensor 16. This centering also takes place by exposure by laser 7, whereby the deviation mirror 25 also masks out the directly reflected beams. As has been mentioned, an adjusting plate 8 as is shown in FIG. 2 in detail serves for the well-known opposing alignment of mask 2 and adjusting plate 8, which forms the first step of the described adjusting process. This is a glass plate whose corner length can be 10 mm, for instance, and whose thickness has a magnitude of 1 mm. On this glass plate there is a chromium layer of 0.5 $\mu$m in which transparent zones have been etched and on which the images 27 of the mask 2 are to be copied by the projection lens 1. The width of the transparent zones 26 can be 1.5 $\mu$m for instance, their length 2 mm. The measurements of the appertaining images 27 of the mask, given a projection ratio of 10:1, are of course ten times larger.

The mark 29 used in dark field adjustment on the adjusting plate 8 is only described in detail in connection with FIG. 5.

Figure 4:
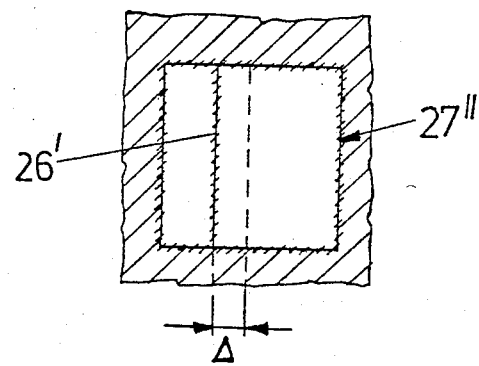
FIG. 4 shows the signal received by the device according to FIG. 3.
Figure 4:
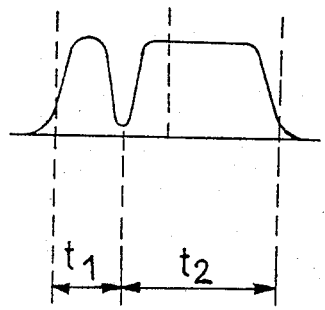

The direct alignment of images 27 of mask 2 and the marks 26 onto the adjusting plate 8 takes place by means of the known device according to FIG. 3, in that a pair of mirrors 30 and 38 are pivoted in that region which must be held free in projection exposure of the substrate 3 in order not to disturb the exposure process. Adjusting light, which typically has a wavelength of 547 or 578 nm and therefore does not affect the photo lacquer on substrate 3 in any significant way, is directed onto a window 27 in the mask 2. The adjusting light reaches the adjusting plate 8 by way of the half-transparent mirror 38 and the deviation mirror 30 through the projection lens 1. If then a window 27 in mask 2 is projected on their marks, then the original image of the pattern shown in FIG. 4 appears on the adjusting plate 8. This is then cast by means of the mirror 30 onto the rotating mirror 36 through the half-transparent mirror 38. This one turns on its axis 37, whereby the back-projected image 27" of the mark 27 and the image 26' of mark 26 is led over the sensor plane 41 of the sensor 31 which has slit 42. The slit 42 is projected onto a sensor 39 by way of a lens 40, and the sensor gives off an electric signal proportional to the received light intensity. The image shown in FIG. 4 is then scanned in the transverse direction. The corresponding signal then increases when the back-projected image of the window 27 reaches the area of slit 42 and decreases after time t1 when the image of the mark 26 dims the slit 42. From the ratio $t_1:t_2$ the deviation of the mark 26 from the ideal position can be determined, in which this mark lies exactly in the center of the image 27' of the window 27 on the adjusting plate 8. The determination of the position of the sensor 16 relative to the adjusting plate 8 takes place in the same way as the determination of the position of the workpiece 3 relative to the sensor 16. What has been said in the following description of FIG. 5 in connection with the adjusting mark 9 on the workpiece 3, also holds true in the same way for the mark 29 on the adjusting plate 8.

During the adjusting process, the exposure of mark 9 takes place by means of the adjusting light which emanates from a He-Ne laser 7, whereby the light beam is broadened at first by an optical device 33 and then deviated in the direction of the optical axis of the projection lens 1 by means of a small deviation mirror 25. The light coming from laser 7 falls as a parallel luminous beam on mark 9 and is then reflected by it on the one hand, and scattered by it on the other. The diffraction image 44 shown in a simplified form in FIG. 5 is then produced in the plane of the deviation mirror 25, whose zero order is masked out by means of the mirror 25. So that this masking out takes place symmetrically, the tilted mirror 25 has an elliptical form. The light scattered by the mark 29 in the region of the projection lens 1 far from the axis then falls within the dark field produced by the mirror 25 onto the sensor 16.

In order to guarantee that only the diffraction image 44 and not additional disturbing light scatter which does not originate from the mark 9 reaches the sensor 16, a screen 43 is installed immediately behind mirror 25, which only allows the diffracted light coming from mark 9 to pass.

Figure 5:
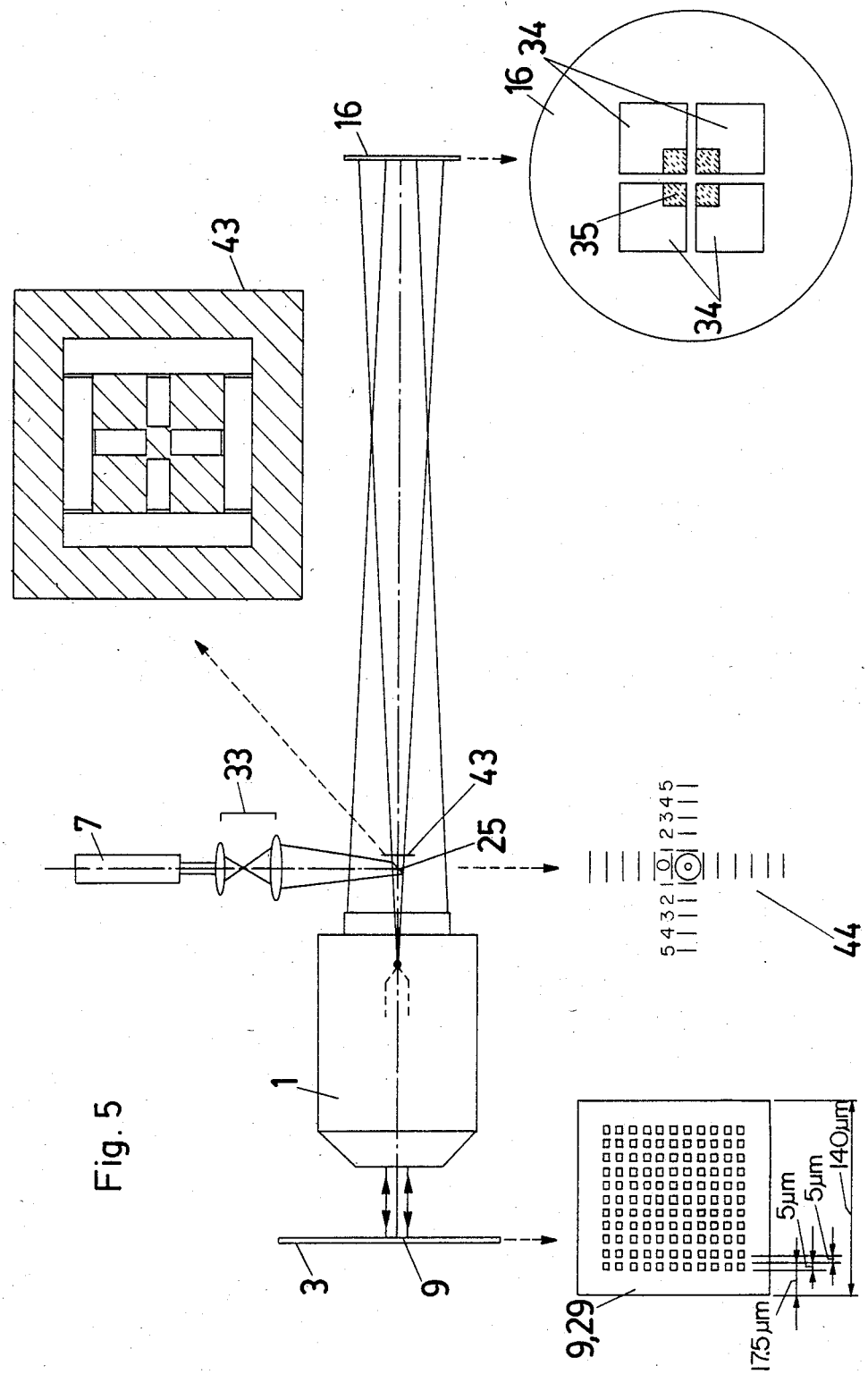
FIG. 5 shows in a schematically simplified form the beam path of the light which leads to the copying af an adjusting mark of the workpiece onto the sensor attached to the mask frame.

If mark 9 has the form of a quadratic pattern as is shown in FIG. 5, then its image 35 on the sensor 16 is also quadratic. Each of the four quadrants of the diode then emits a signal which is dependent on the light intensity and the size of the exposed surface. The mark 9 is then oriented in relation to the diode, when the signals which have been sent from the individual quadrants 34 are equally large.

As has been mentioned, the invention has the particular advantage that the orientation of the mask 2 to the wafer 3 can be concluded with a displacement of mask 2. For this it is only necessary to displace the sensor 16 as against the mark 9 in order to orient the sensor 16 which is after all fastened onto the frame 17 carrying the mask 2.

In order to obtain as high a light intensity of the image 35 as possible, it is recommended to construct the marks 9 or 29 as lattices with lines crossing themselves as is shown in FIG. 5, but the invention is not limited to this particular type of mark.

While the invention has been described with reference to its perferred embodiments, it will be understood that modifications and variations will occur to those skilled in the art. Such modifications and variations are intended to fall within the scope of the appended claims.

What is claimed is:

1. Device for projection copying of masks onto a workpiece, particularly onto a semiconductor substrate, for the manufacturing of integrated circuits, comprising:

a projection lens through which patterns of the masks are passed for copying once or several times onto a light-sensitive layer of the workpiece, the mask and workpiece being oriented to each other in a relative way on opposite sides of said projection lens such that an orientation pattern of the mask and an adjusting mark of the workpiece are thereby brought into a predetermined spatial arrangement so that a relative position of a position-sensitive sensor as well as of the orientation pattern of the mask and at least one reference mark for the workpiece of a base table are determined before the adjusting mark is then copied onto the sensor, said workpiece being positioned on said base table, said projection lens also copying the adjusting mark of the workpiece onto the sensor with directly reflecting rays of light, which make visible the adjusting mark, being faded out, said position-sensitive sensor being installed on an underside of a frame carrying the mask, said underside being a side of said frame facing said projection lens.

2. Device according to claim 1 wherein the workpiece comprises several adjusting marks and the adjusting marks of the workpiece are in a form of a diffraction grid with lines crossing themselves.

3. Device according to claim 2 wherein the sensor is in a form of a quadrant diode.

4. Device according to claim 1 further comprising a deviation mirror for masking out a center of a light cone emanating from the adjusting mark of the workpiece to expose the adjusting mark of the workpiece.

5. Device according to claim 1 further comprising a pair of mirrors for compensating for, by an adjusting light and an exposure light, a focal distance of the projection lens.

* * * * *